US012765126B2

(12) United States Patent
Sun et al.

(10) Patent No.: US 12,765,126 B2
(45) Date of Patent: Oct. 13, 2026

(54) DISPLAY PANELS AND DISPLAY DEVICES

(71) Applicant: GUANGZHOU CHINA STAR OPTOELECTRONICS SEMICONDUCTOR DISPLAY TECHNOLOGY CO., LTD., Guangzhou (CN)

(72) Inventors: Hejing Sun, Guangzhou (CN); Xing Lei, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 585 days.

(21) Appl. No.: 18/208,592

(22) Filed: Jun. 12, 2023

(65) Prior Publication Data

US 2024/0387777 A1 Nov. 21, 2024

(30) Foreign Application Priority Data

May 17, 2023 (CN) ........................ 202310558057.2

(51) Int. Cl.
*H10H 20/83* (2025.01)
*H10W 90/00* (2026.01)

(52) U.S. Cl.
CPC ............ *H10H 20/83* (2025.01); *H10W 90/00* (2026.01)

(58) Field of Classification Search
CPC ..... H10H 20/83; H10H 20/857; H10W 90/00; G09F 9/33
See application file for complete search history.

(56) References Cited

U.S. PATENT DOCUMENTS

2021/0305221 A1 9/2021 Wang et al.
2021/0358393 A1 11/2021 Kang et al.
2021/0384252 A1 12/2021 Lee et al.
(Continued)

FOREIGN PATENT DOCUMENTS

CN 207353247 U 5/2018
CN 113571627 A 10/2021
(Continued)

OTHER PUBLICATIONS

PCT International Search Report for International Application No. PCT/CN2024/073621, mailed on Apr. 8, 2024, 7pp.
(Continued)

*Primary Examiner* — Ratisha Mehta
(74) *Attorney, Agent, or Firm* — The Roy Gross Law Firm, LLC; Roy D. Gross

(57) ABSTRACT

Display panels and display devices are provided. The display device includes the display panel, which includes a plurality light-emitting chips arranged in an array. Each light-emitting chip includes an N pole and a P pole. The light-emitting chips in a same column are arranged to share a common N pole or a common P pole. At least one column of light-emitting chips are arranged in a first light-emitting area, and at least one column of light-emitting chips are arranged in a second light-emitting area adjacent to the first light-emitting area. The light-emitting chips in the first light-emitting area and the light-emitting chips in the second light-emitting area are mirror-symmetrical.

6 Claims, 3 Drawing Sheets

(56) References Cited

U.S. PATENT DOCUMENTS

| | | | | |
|---|---|---|---|---|
| 2023/0029972 | A1* | 2/2023 | Qin | H10H 20/857 |
| 2023/0238390 | A1* | 7/2023 | Tsai | G02F 1/136286<br>257/66 |
| 2024/0047469 | A1* | 2/2024 | Wang | H10D 86/60 |

FOREIGN PATENT DOCUMENTS

| | | | |
|---|---|---|---|
| CN | 114093907 | A | 2/2022 |
| CN | 114708816 | A | 7/2022 |
| CN | 217468426 | U | 9/2022 |
| JP | 2014072215 | A | 4/2014 |
| JP | 2021529352 | A | 10/2021 |
| JP | 2021532401 | A | 11/2021 |
| JP | 2022501645 | A | 1/2022 |
| WO | 2013086794 | A1 | 6/2013 |

OTHER PUBLICATIONS

PCT Written Opinion of the International Searching Authority for International Application No. PCT/CN2024/073621, mailed on Apr. 8, 2024, 8pp.

Japanese Office Action issued in corresponding Japanese Patent Application No. 特願2023-208785 dated Aug. 6, 2024, pp. 1-3, 6pp.

* cited by examiner

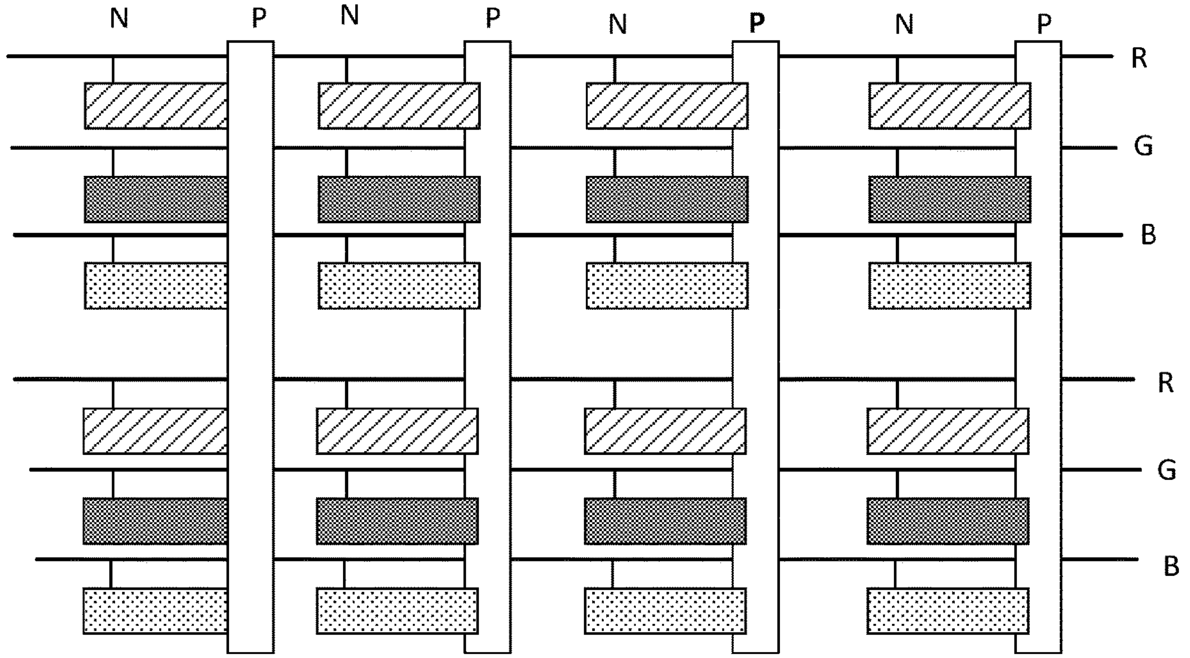
FIG. 1—related art—
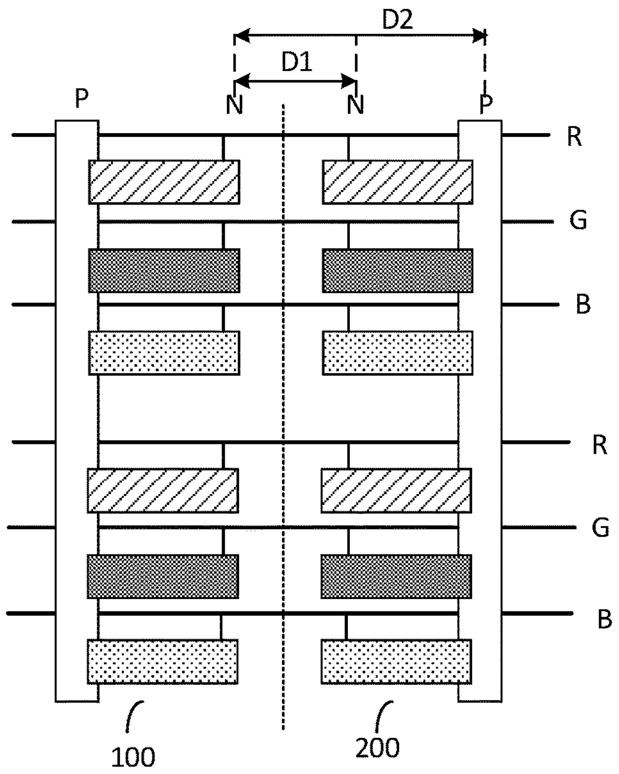
FIG. 2

DISPLAY PANELS AND DISPLAY DEVICES

CROSS-REFERENCE TO RELATED APPLICATION

This application claims priority to Chinese Patent Application No. 202310558057.2, filed on May 17, 2023, the disclosure of which is incorporated herein by reference in its entirety.

TECHNICAL FIELD

The present disclosure relates to the field of display technologies, and in particular, to display panels and display devices.

BACKGROUND

With the increasing popularity of Mini-LED direct display technology in the market, people's requirements for its quality are also constantly improving. When a mini-LED display screen displays a white image, the color of the image is different between a left side-view and a right side-view, and the color viewed from one side is green and from the other side is red, which seriously affects image quality.

SUMMARY

In view of above, display panels are provided according to embodiments of the present disclosure. The display device includes the display panel, which includes a plurality light-emitting chips arranged in an array; each light-emitting chip includes an N pole and a P pole; the light-emitting chips in a same column are arranged to share a common N pole or a common P pole; at least one column of light-emitting chips are arranged in a first light-emitting area, and at least one column of light-emitting chips are arranged in a second light-emitting area adjacent to the first light-emitting area; the light-emitting chips in the first light-emitting area and the light-emitting chips in the second light-emitting area are mirror-symmetrical.

Furthermore, display devices are provided according to embodiments of the present disclosure. The display device includes the above display panel.

BRIEF DESCRIPTION OF THE DRAWINGS

FIG. 1 is a schematic view of light-emitting chips of a display panel in related art.

FIG. 2 is a schematic view of light-emitting chips of a display panel according to an embodiment of the present disclosure.

DETAILED DESCRIPTION

Figure 3:
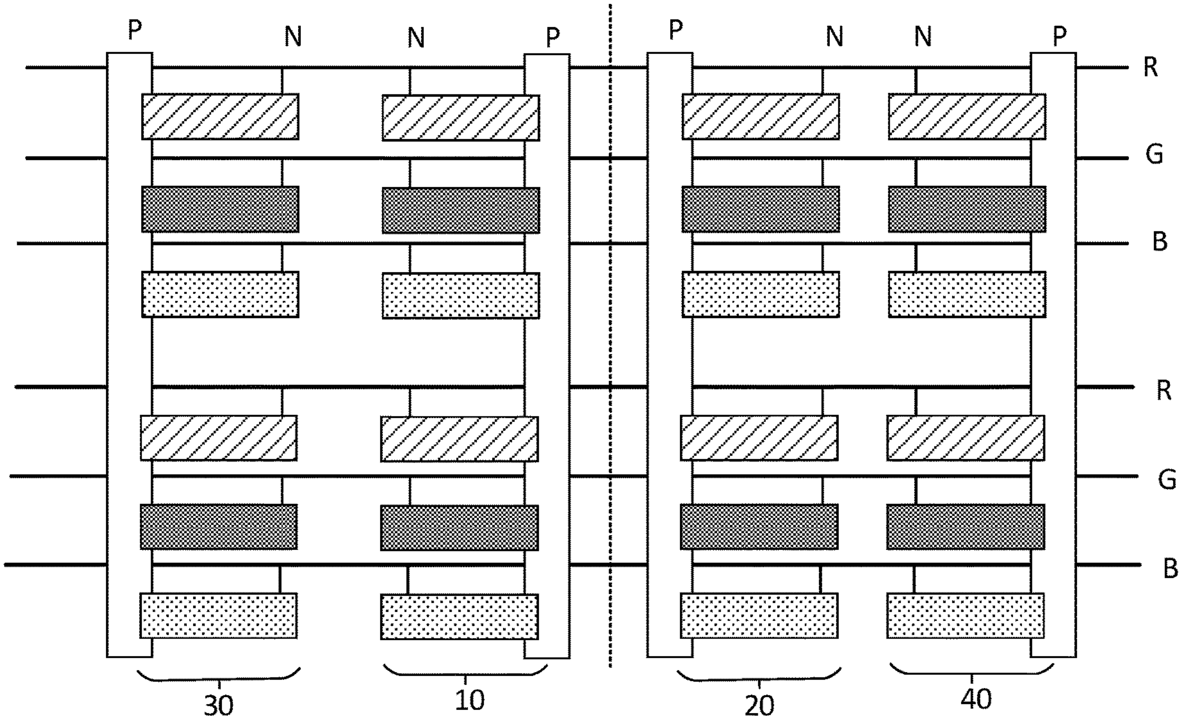
FIG. 3 is a schematic view of light-emitting chips of a display panel according to another embodiment of the present disclosure.

Some embodiments of the present disclosure will be described below in detail with reference to the accompanying drawings, but not intended to limit the present disclosure.

In the illustration of the present disclosure, it should be understood that orientation and positional relationships indicated by the terms "center", "longitudinal", "transverse", "length", "width", "thickness", "upper", "lower", "front", "back", "left", "right", "vertical", "horizontal", "lateral", "top", "bottom", "inner", "outer", "clockwise", "counterclockwise", etc. are based on the orientation or positional relationship shown in the drawings, which is only for the convenience of illustrating the present disclosure and simplifying the description, rather than indication or implies that the device or component must have a specific orientation to a specific orientation configuration and operation, and therefore should not be construed as limiting the present disclosure. In addition, the terms, such as "first", "second", "third", "fourth", and so on, are only used for descriptive purposes and cannot be understood as indicating or implying relative importance or implicitly indicating the number of indicated technical features.

In the present disclosure, the term "exemplary" is used to mean "serving as an example, example illustration, or illustration". Any embodiment described in the present disclosure as "exemplary" is not necessarily to be construed as preferred or advantageous over other embodiments. The following description is given to enable those skilled in the art to make and use the present disclosure. In the following description, details are set forth for purposes of explanation. It should be understood that those skilled in the art would recognize that the present disclosure may be practiced without these specific details. In other embodiments, well-known structures and processes are not described in detail to avoid obscuring the description of the present disclosure with unnecessary detail. Thus, the present disclosure is not intended to be limited to the embodiments shown, but is to be accorded the widest scope consistent with the principles and features disclosed in the present disclosure.

Embodiments of the present disclosure provide display panels, which will be described in detail below.

Referring to FIG. 1, it is a schematic view of light-emitting chips of a display panel in related art. The display panel shown in FIG. 1 includes a plurality of light-emitting chips arranged in an array. It should be noted that the light-emitting chip in the present disclosure is generally a flip chip, which has disadvantage of asymmetry of left and right light patterns, which leads to color deviation of the display panel in side-views.

In order to solve the problem of color deviation of the display panel in side-views, the present disclosure provides a new design structure of the light-emitting chip. As shown in FIG. 2, it is a schematic view of light-emitting chips of a display panel according to an embodiment of the present disclosure. In the embodiment shown in FIG. 2, only the structures of some light-emitting chips in the display panel are shown, but not all the light-emitting chips in the complete display panel are included. It should be noted that, in the embodiment shown in FIG. 2, the display panel also includes multiple columns of light-emitting chips arranged in an array, and each light-emitting chip includes an N pole and a P pole, and the N pole and the P pole are structures of the light-emitting chip itself. In addition, multiple light-emitting chips in any column of the multiple columns of light-emitting chips are arranged to share a common N pole or a common P pole.

Referring to FIG. 2, in the embodiment shown in FIG. 2, the display panel includes adjacent first light-emitting area 100 and second light-emitting area 200. At least one column of light-emitting chips 10 are arranged in the first light-emitting area 100, and at least one column of light-emitting chips 10 are arranged in the second light-emitting area 200. The light-emitting chips 10 in a first column in the first light-emitting area 100 are arranged to share a common N pole or a common P pole, and the light-emitting chips in a second column in the second light-emitting area 200 are also arranged to share a common N pole or a common P pole. That is, the N poles of the multiple light-emitting chips are arranged at same ends, or the P poles of the multiple light-emitting chips are arranged at same ends. In the embodiment shown in FIG. 2, multiple light-emitting chips form an array structure of multiple rows and multiple columns. The N poles of multiple light-emitting chips in a same column are connected to a same scan line, or the P poles of multiple light-emitting chips in a same column are connected to a same scan line.

At the same time, in the embodiment shown in FIG. 2, the light-emitting chips 10 in the first column and the light-emitting chips 20 in the second column are mirror-symmetrically arranged. Such arrangement can make the N poles and P poles of the light-emitting chips 10 in the first column mirror symmetrical to the N poles and P poles of the light-emitting chips 20 in the second column. Specifically, the N poles of the light-emitting chips 10 in the first column and the N poles of the light-emitting chips 20 in the second column are mirror-symmetrical, and the P poles of the light-emitting chips 10 in the first column and the P poles of the light-emitting chips 20 in the second column are mirror-symmetrical. Referring to FIG. 1, although multiple light-emitting chips in the related art shown in FIG. 1 are also arranged in an array, the scan lines corresponding to each of the multiple light-emitting chips are arranged on the right or left side of the light-emitting chip. For the plurality of light-emitting chips provided by the present disclosure shown in FIG. 2, some light-emitting chips are provided with corresponding scan lines arranged on their left sides, and another light-emitting chips are provided with corresponding scan lines arranged on their right sides. In this way, the plurality of light-emitting chips presents as a mirror-symmetrical structure.

For the first column of light-emitting chips 10 and the second column of light-emitting chips 20 that are mirror-symmetrical, such arrangement makes the electrodes having same polarity (N pole or P pole) of the light-emitting chips in different columns be located on an outside or inside of the whole structure at the same time. Specifically referring to FIG. 2, the P poles of the light-emitting chips 10 in the first column are located on the outside, and the N poles of the light-emitting chips 10 in the first column are located on the inside. Since the second column of light-emitting chips 20 and the first column of light-emitting chips 10 are mirror-symmetrical, the P poles of the light-emitting chips in the second column are also located on the outside, and the N poles of the light-emitting chips in the second column are located on the inside. Only in this way can a mirror-symmetrical structure be achieved. At this time, the P poles of the light-emitting chips in the first column and the P poles of the light-emitting chips in the second column adjacent to the first column are located on the outer sides, and there will be no color deviation in side-views caused by different electrodes due to the N poles and P poles being located on the outermost sides at the same time.

The display panel provided by the present disclosure includes a plurality of light-emitting chips arranged in an array, and each light-emitting chip includes the N pole and the P pole. Multiple light-emitting chips are arranged to share a common N pole or a common P pole. The plurality of light-emitting chips arranged in an array include adjacent first column of light-emitting chips and second column of light-emitting chips, and light-emitting chips in the first column and the light-emitting chips in the second column are mirror-symmetrically arranged. In the display panel provided by the present disclosure, two adjacent columns of light-emitting chips are mirror-symmetrically arranged, so as to avoid the problem of asymmetric light-emitting brightness curves of the light-emitting chips at the left and right sides, thereby eliminating the problem of color deviation when the display panel is viewed from sides.

In the above embodiment, since the first column of light-emitting chips 10 and the second column of light-emitting chips 20 are mirror-symmetrical, a minimum distance D1 between the N pole of the light-emitting chip 10 in the first column and the N pole of the light-emitting chip 20 in the second column is less than a minimum distance D2 between the N pole of the light-emitting chip 10 in the first column and the P pole of the light-emitting chip 20 in the second column.

Referring to FIG. 1 and FIG. 2, the adjacent first column of light-emitting chips 10 and the second column of light-emitting chips 20 are taken as an example.

For the first column of light-emitting chips 10 in FIG. 1, the N poles are located on the outside, and the P poles are located on the inside; and for the second column of light-emitting chips 20 in FIG. 1, the N poles are located on the inside, and the P poles are located on the outside. In FIG. 1, the P poles of the light-emitting chips 10 in the first column are inserted between the N poles of the light-emitting chips 10 in the first column and the N poles of the light-emitting chips 20 in the second column. At this time, the N poles of the light-emitting chips 10 in the first column and the P poles of the light-emitting chips 20 in the second column are respectively located on the outsides, resulting in the problem of color deviation in side-views.

For the first column of light-emitting chips 10 and the second column of light-emitting chips 20 in FIG. 2, both the N poles of the light-emitting chips 10 in the first column and the N poles of the light-emitting chips 20 in the second column are located on the inside, and both the P poles of the light-emitting chips 10 in the first column and the P poles of the light-emitting chips 20 in the second column are located on the outside. The P poles of the light-emitting chips 10 in the first column or the P poles of the light-emitting chips 20 in the second column are not inserted between the N poles of the light-emitting chips 10 in the first column and the N poles of the light-emitting chips 20 in the second column. This also means that the minimum distance D1 between the N pole of the light-emitting chip in the first column and the N pole of the light-emitting chip in the second column is less than the minimum distance D2 between the N pole of the light-emitting chip in the first column and the P pole of the light-emitting chip in the second column. On the contrary, in the display panel shown in FIG. 1, a minimum distance between the N pole of the light-emitting chip in the first column and the N pole of the light-emitting chip in the second column is greater than a minimum distance between the N pole of the light-emitting chip in the first column and the P pole of the light-emitting chip in the second column.

The above embodiment describes a case where the N poles are located on the insides. In other embodiments, the P poles of the light-emitting chips 10 in the first column and the P poles of the light-emitting chips 20 in the second column may also be located on the insides. At this time, a minimum distance between the P pole of the light-emitting chip 10 in the first column and the P pole of the light-emitting chip 20 in the second column is also less than a minimum distance between the P pole of the light-emitting chip 10 in the first column and the N pole of the light-emitting chip 20 in the second column. Whether the P poles of the light-emitting chips 10 in the first column and the P poles of the light-emitting chips 20 in the second column are located on the inside or outside at the same time, the light-emitting chips 10 in the first column and the light-emitting chips 20 in the second column are arranged as a mirror-symmetrical structure, and the N-poles and P-poles of the light-emitting chips 10 in the first column and the N-poles and P-poles of the light-emitting chips 20 in the second column also arranged as a mirror-symmetrical structure. This arrangement makes the electrodes located on the outside have a same type, such as all N poles or all P poles, and also makes the electrodes on the outside of the entire display panel have the same type, such as all N poles or all P poles, thereby avoiding the problem of color deviation caused by different electrodes.

In an actual display panel, at least two adjacent columns of light-emitting chips are generally arranged as a mirror-symmetrical structure, instead of two separate light-emitting chips being arranged as a mirror-symmetrical structure. It should be noted that the embodiment shown in FIG. 2 only shows some light-emitting chips arranged mirror-symmetrically, and the structures of other light-emitting chips other than the light-emitting chip shown in FIG. 2 are not limited. Arranging some of the light-emitting chips in the display panel according to the structure shown in FIG. 2 can alleviate the problem of color deviation to a certain extent.

The above embodiment describes that there are only the first column of light-emitting chips 10 in the first light-emitting area 100, only the second column of light-emitting chips 20 in the second light-emitting area 200, and the two adjacent columns of light-emitting chips are arranged to be mirror-symmetrical. In some other embodiments, more columns of light-emitting chips may be further arranged in the first light-emitting area 100, and similarly, more columns of light-emitting chips may be further arranged in the second light-emitting area 200.

As shown in FIG. 3, it is a schematic view of light-emitting chips of a display panel according to another embodiment of the present disclosure. In the embodiment shown in FIG. 3, there are four or more even-numbered columns of light-emitting chips adjacent to each other in sequence. Light-emitting chips in the first light-emitting area 100 may include the first column of light-emitting chips 10 and a third column of light-emitting chips 30 adjacent to the first column. Light-emitting chips in the second light-emitting area 200 may include the second column of light-emitting chips 20 and a fourth column of light-emitting chips 40 adjacent to the second column. The even-numbered columns of light-emitting chips include the first column of light-emitting chips 10 and the second column of light-emitting chips 20 that are mirror-symmetrical, and the first column of light-emitting chips and the second column of light-emitting chips are located at a middle position of the even-numbered columns of light-emitting chips. The third column of light-emitting chips 30 is located on the left side of the first column of light-emitting chips 10, and the fourth column of light-emitting chips 40 is located on the right side of the second column of light-emitting chips 20.

In the embodiment shown in FIG. 3, not only the first column of light-emitting chips 10 and the second column of light-emitting chips 20 are mirror-symmetrical, but the third column of light-emitting chips and the first column of light-emitting chips 30 are also mirror-symmetrical, and the second column of light-emitting chips 20 and the fourth column of light-emitting chips 40 are also arranged mirror-symmetrically. The polarity of the two columns of light-emitting chips in the first light-emitting area on the left is PNNP from left to right, and the polarity of the two columns of light-emitting chips in the second light-emitting area on the right is PNNP from left to right. An overall structure composed of the first column of light-emitting chips 10 and the third column of light-emitting chips 30 in the first light-emitting area 100 and an overall structure composed of the second column of light-emitting chips 20 and the fourth column of light-emitting chips 40 in the second light-emitting area 200 are mirror symmetrical. For the embodiment shown in FIG. 3, the light-emitting chips in different light-emitting areas are arranged in a same manner, so that under a premise that the light-emitting chips in a single light-emitting area maintain a mirror-symmetrical structure, an overall structure formed by multiple light-emitting areas is also mirror-symmetrical.

At this time, a minimum distance between the N pole of the light-emitting chip in the third column and the N pole of the light-emitting chip in the first column is less than a minimum distance between the N pole of the light-emitting chip in the third column and the P pole of the light-emitting chip in the first column, and a minimum distance between the N pole of the light-emitting chip in the second column and the N pole of the light-emitting chip in the fourth column is less than a minimum distance between the N pole of the light-emitting chip in the second column and the P pole of the light-emitting chip in the fourth column. In other words, the electrodes of the third column of light-emitting chips 30, the first column of light-emitting chips 10, the second column of light-emitting chips 20, and the fourth column of light-emitting chips 40 are arranged in an order of PNNP-PNNP, and the whole structure is also a mirror symmetrical structure. The electrodes located on the outermost sides of the whole structure are the same type of electrodes, all of which are P poles, so this arrangement can also avoid the problem of color deviation caused by different electrodes.

Figure 4:
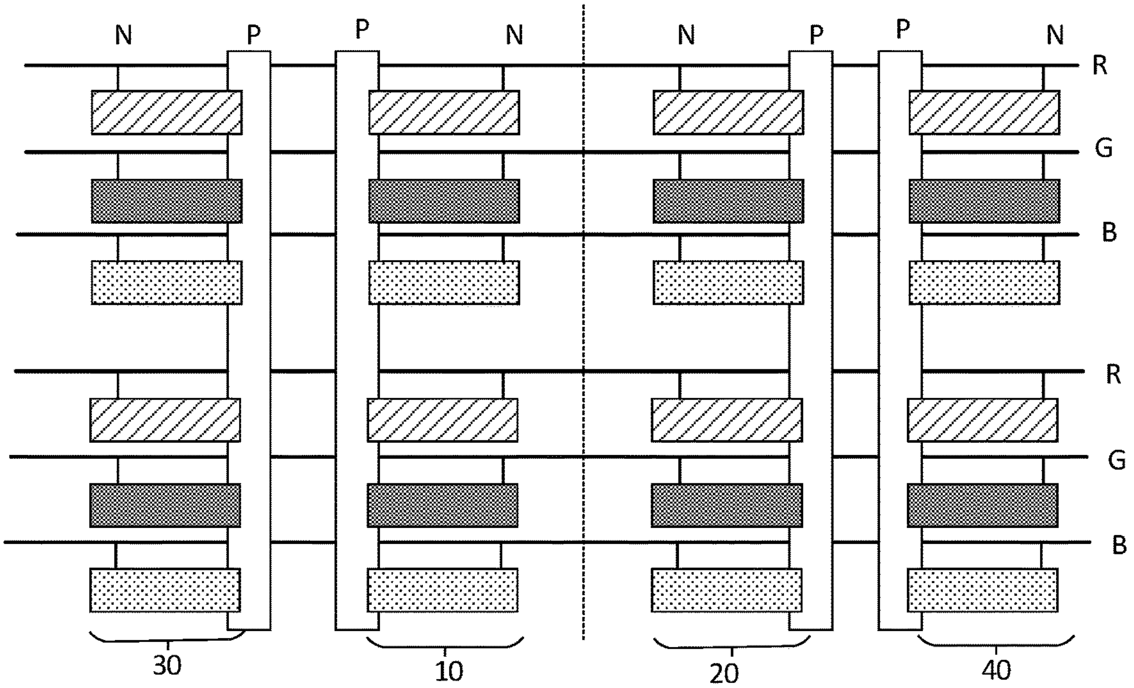
FIG. 4 is a schematic view of light-emitting chips of a display panel according to another embodiment of the present disclosure.

As shown in FIG. 4, it is a schematic view of light-emitting chips of a display panel according to another embodiment of the present disclosure. In FIG. 4, the display panel also includes four or more even-numbered columns of light-emitting chips that are adjacent to each other in sequence. Light-emitting chips in the first light-emitting area 100 may include the first column of light-emitting chips 10 and a third column of light-emitting chips 30 adjacent to the first column. Light-emitting chips in the second light-emitting area 200 may include the second column of light-emitting chips 20 and a fourth column of light-emitting chips 40 adjacent to the second column.

But different from the embodiment shown in FIG. 3, in the embodiment shown in FIG. 4, a minimum distance between the N pole of the light-emitting chip in the third column and the N pole of the light-emitting chip in the first column is greater than a minimum distance between the N pole of the light-emitting chip in the third column and the P pole of the light-emitting chip in the first column, and a minimum distance between the N pole of the light-emitting chip in the second column and the N pole of the light-emitting chip in the fourth column is greater than a minimum distance between the N pole of the light-emitting chip in the second column and the P pole of the light-emitting chip in the fourth column. In other words, the electrodes of the third column of light-emitting chips 30, the first column of light-emitting chips 10, the second column of light-emitting chips 20, and the fourth column of light-emitting chips 40 are arranged in an order of NPPN-NPPN, and the whole structure is also a mirror symmetrical structure. The electrodes located on the outermost sides of the whole structure are the same type of electrodes, all of which are N poles, so this arrangement can also avoid the problem of color deviation caused by different electrodes.

Figure 5:
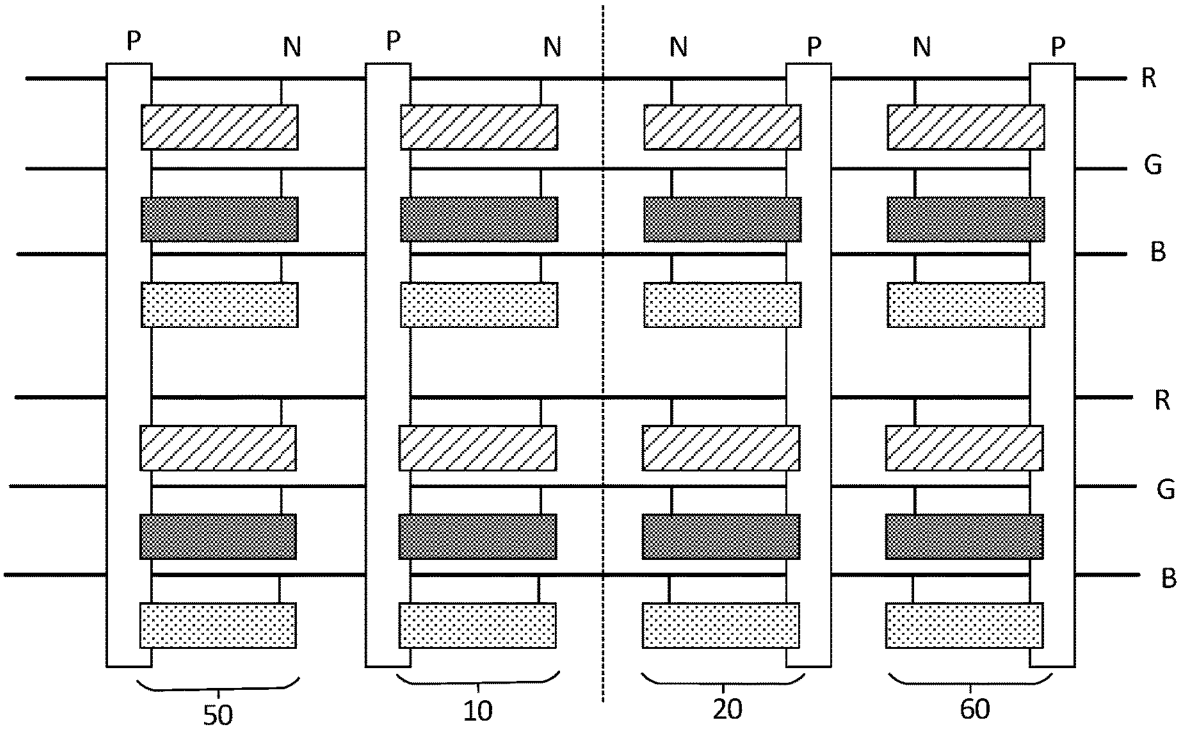
FIG. 5 is a schematic view of light-emitting chips of a display panel according to another embodiment of the present disclosure.

As shown in FIG. 5, it is a schematic view of light-emitting chips of a display panel according to another embodiment of the present disclosure. In the embodiment shown in FIG. 5, the display panel also includes four or more even-numbered columns of light-emitting chips that are adjacent to each other in sequence. Light-emitting chips in the first light-emitting area 100 may include the first column of light-emitting chips 10 and a fifth column of light-emitting chips 50 adjacent to the first column. Light-emitting chips in the second light-emitting area 200 may include the second column of light-emitting chips 20 and a sixth column of light-emitting chips 60 adjacent to the second column. Herein, an arrangement of the P poles and the N poles of the fifth column of light-emitting chips 50 is the same as an arrangement of the P poles and the N poles of the first column of light-emitting chips 10, and an arrangement of the P poles and the N poles of the second column of light-emitting chips 20 is the same as an arrangement of the P poles and the N poles of the sixth column of light-emitting chips 60. The light-emitting chips 50 in the fifth column and the light-emitting chips 60 in the sixth column are mirror-symmetrical, and the light-emitting chips 10 in the first column and the light-emitting chips 20 in the second column are mirror-symmetrical.

Different from the embodiments shown in FIG. 3 and FIG. 4, in which, adjacent two columns of light-emitting chips in the first light-emitting area or the second light-emitting area are also mirror-symmetrically arranged, in the display panel shown in FIG. 5, the fifth column of light-emitting chips 50 and the first column of light-emitting chips 10 adjacent to each other in the first light-emitting area 100 are not mirror-symmetrically arranged, and similarly, the light-emitting chips 20 in the second column and the light-emitting chips 60 in the sixth column adjacent to each other in the second light-emitting area 200 are not mirror-symmetrically arranged. An overall structure composed of multiple columns of light-emitting chips in the first light-emitting area and an overall structure composed of multiple columns of light-emitting chips in the second light-emitting area 200 are still mirror-symmetrically arranged, so as to ensure that electrodes at the outermost of the overall structure are still same, such as both are N poles or both are P poles, so as to avoid the problem of color deviation.

In the embodiment shown in FIG. 5, a minimum distance between the N pole of the light-emitting chip in the fifth column and the P pole of the light-emitting chip in the first column is less than a minimum distance between the N pole of the light-emitting chip in the fifth column and the N pole of the light-emitting chip in the first column, and a minimum distance between the N pole of the light-emitting chip in the second column and the P pole of the light-emitting chip in the sixth column is greater than a minimum distance between the N pole of the light-emitting chip in the second column and the N pole of the light-emitting chip in the sixth column. At this time, the electrodes of the fifth column of light-emitting chips 50, the first column of light-emitting chips 10, the second column of light-emitting chips 20, and the sixth column of light-emitting chips 60 are arranged in an order of PNPN-NPNP. Although multiple columns of light-emitting chips in a single display area are not mirror-symmetrically arranged, the entire structure is also mirror-symmetrically arranged. The electrodes located on the outermost sides of the whole structure are the same type of electrodes, all of which are P poles, so this arrangement can also avoid the problem of color deviation caused by different electrodes.

Figure 6:
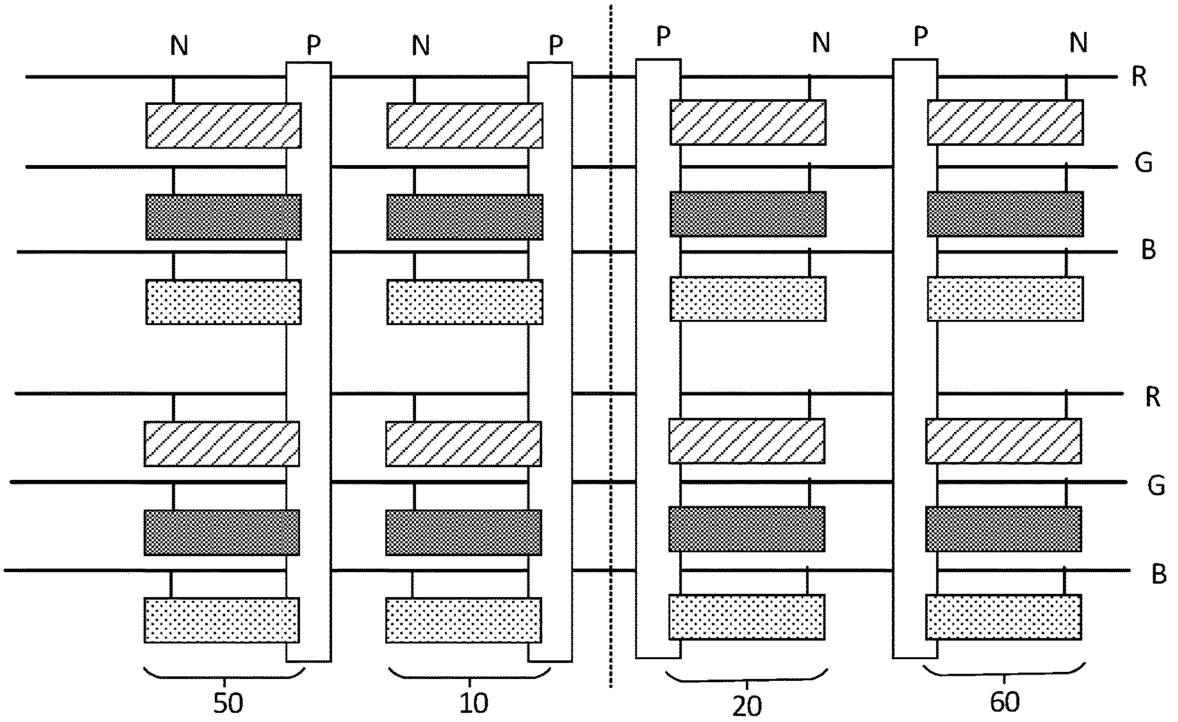
FIG. 6 is a schematic view of light-emitting chips of a display panel according to another embodiment of the present disclosure.

As shown in FIG. 6, it is a schematic view of light-emitting chips of a display panel according to another embodiment of the present disclosure. In the embodiment shown in FIG. 6, the display panel also includes four or more even-numbered columns of light-emitting chips that are adjacent to each other in sequence. Light-emitting chips in the first light-emitting area 100 may include the first column of light-emitting chips 10 and the fifth column of light-emitting chips 50 adjacent to the first column. Light-emitting chips in the second light-emitting area 200 may include the second column of light-emitting chips 20 and the sixth column of light-emitting chips 60 adjacent to the second column. Herein, an arrangement of the P poles and the N poles of the fifth column of light-emitting chips 50 is the same as an arrangement of the P poles and the N poles of the first column of light-emitting chips 10, and an arrangement of the P poles and the N poles of the second column of light-emitting chips 20 is the same as an arrangement of the P poles and the N poles of the sixth column of light-emitting chips 60. The light-emitting chips 50 in the fifth column and the light-emitting chips 60 in the sixth column are mirror-symmetrical, and the light-emitting chips 10 in the first column and the light-emitting chips 20 in the second column are mirror-symmetrical.

Different from the embodiment shown in FIG. 5, in the display panel shown in FIG. 6, a minimum distance between the N pole of the light-emitting chip in the fifth column and the P pole of the light-emitting chip in the first column is greater than a minimum distance between the N pole of the light-emitting chip in the fifth column and the N pole of the light-emitting chip in the first column, and a minimum distance between the N pole of the light-emitting chip in the second column and the P pole of the light-emitting chip in the sixth column is less than a minimum distance between the N pole of the light-emitting chip in the second column and the N pole of the light-emitting chip in the sixth column. At this time, the electrodes of the fifth column of light-emitting chips 50, the first column of light-emitting chips 10, the second column of light-emitting chips 20, and the sixth column of light-emitting chips 60 are arranged in an order of NPNP-PNPN. Although multiple columns of light-emitting chips in a single display area are not mirror-symmetrically arranged, the entire structure is also mirror-symmetrically arranged. The electrodes located on the outermost sides of the whole structure are the same type of electrodes, all of which are N poles, so this arrangement can also avoid the problem of color deviation caused by different electrodes.

It should be noted that, in the embodiments of the present disclosure, there is no restriction on the direction of the N pole and the P pole, and it is only necessary to ensure that the light-emitting chips on a same column share a common N pole or a common P pole, and it is sufficient to ensure that the multiple columns of light-emitting chips can be mirror-symmetrical (mainly mirror-symmetrical to the electrodes).

A number of columns in the light-emitting chips in the first light-emitting area 100 and a number of columns in the light-emitting chips in the second light-emitting area 200 are generally same, so as to ensure that the overall structure is mirror-symmetrical. When multiple columns of light-emitting chips are arranged in both the first light-emitting area 100 and the second light-emitting area 200, it doesn't matter whether the multiple columns of light-emitting chips in the first light-emitting area 100 are mirror-symmetrical or not, and similarly, it doesn't matter whether the multiple columns of light-emitting chips in the second light-emitting area 200 are mirror-symmetrical or not.

The present disclosure also provides a display device, which includes the display panel described in any one of the foregoing embodiments, which will not be repeated here.

In the above-mentioned embodiments, the descriptions of each embodiment have their own emphases. For the part that is not described in detail in a certain embodiment, refer to the detailed description of other embodiments above, and will not be repeated here.

During specific implementation, each of the above units or structures can be implemented as an independent entity, or can be combined arbitrarily as the same or several entities. For the specific implementation of each of the above units or structures, please refer to the previous method embodiments, and will not be repeated here.

For the specific implementation of the above operations, reference may be made to the foregoing embodiments, and details are not repeated here.

The display panels according to embodiments of the present disclosure have been described above in detail. In this paper, specific examples are used to illustrate the principle and implementation of the invention. The description of the above embodiments is only used to help understand the method of the present disclosure and its core idea. Those skilled in the art can make various changes and modifications without departing from the spirit of the present disclosure. Therefore, the described embodiments are not intended to limit the present disclosure.

What is claimed is:

1. A display panel, comprising a plurality of light-emitting chips arranged in an array, and each of the light-emitting chips comprising an N pole and a P pole, wherein the light-emitting chips in a same column are arranged to share a common N pole or a common P pole;

at least one column of the light-emitting chips are arranged in a first light-emitting area;

at least one column of the light-emitting chips are arranged in a second light-emitting area adjacent to the first light-emitting area; and the light-emitting chips in the first light-emitting area and the light-emitting chips in the second light-emitting area are mirror-symmetrical;

wherein the light-emitting chips arranged in the first light-emitting area comprise a first column of light-emitting chips and a fifth column of light-emitting chips adjacent to each other, the light-emitting chips arranged in the second light-emitting area comprise a second column of light-emitting chips and a sixth column of light-emitting chips adjacent to each other, and the first column of light-emitting chips and the second column of light-emitting chips are adjacent to each other;

an arrangement of P poles and N poles of the fifth column of light-emitting chips and an arrangement of P poles and N poles of the first column of light-emitting chips are same;

an arrangement of P poles and N poles of the second column of light-emitting chips and an arrangement of P poles and N poles of the sixth column of light-emitting chips are same;

the fifth column of light-emitting chips and the sixth column of light-emitting chips are mirror-symmetrical; and the first column of light-emitting chips and the second column of light-emitting chips are mirror-symmetrical.

2. The display panel according to claim 1, wherein a minimum distance between each of the N poles of the fifth column of light-emitting chips and each of the P poles of the first column of light-emitting chips is less than a minimum distance between each of the N poles of the fifth column of light-emitting chips and each of the N poles of the first column of light-emitting chips; and a minimum distance between each of the N poles of the second column of light-emitting chips and each of the P poles of the sixth column of light-emitting chips is less than a minimum distance between each of the N poles of the second column of light-emitting chips and each of the N poles of the sixth column of light-emitting chips.

3. The display panel according to claim 1, wherein a minimum distance between each of the N poles of the fifth column of light-emitting chips and each of the P poles of the first column of light-emitting chips is greater than a minimum distance between each of the N poles of the fifth column of light-emitting chips and each of the N poles of the first column of light-emitting chips; and a minimum distance between each of the N poles of the second column of light-emitting chips and each of the P poles of the sixth column of light-emitting chips is less than a minimum distance between each of the N poles of the second column of light-emitting chips and each of the N poles of the sixth column of light-emitting chips.

4. A display device, comprising a display panel comprising a plurality of light-emitting chips arranged in an array, and each of the light-emitting chips comprising an N pole and a P pole, wherein the light-emitting chips in a same column are arranged to share a common N pole or a common P pole;

at least one column of the light-emitting chips are arranged in a first light-emitting area;

at least one column of the light-emitting chips are arranged in a second light-emitting area adjacent to the first light-emitting area; and the light-emitting chips in the first light-emitting area and the light-emitting chips in the second light-emitting area are mirror-symmetrical;

wherein the light-emitting chips arranged in the first light-emitting area comprise a first column of light-emitting chips and a fifth column of light-emitting chips adjacent to each other, the light-emitting chips arranged in the second light-emitting area comprise a second column of light-emitting chips and a sixth column of light-emitting chips adjacent to each other, and the first column of light-emitting chips and the second column of light-emitting chips are adjacent to each other;

an arrangement of P poles and N poles of the fifth column of light-emitting chips and an arrangement of P poles and N poles of the first column of light-emitting chips are same;

an arrangement of P poles and N poles of the second column of light-emitting chips and an arrangement of P poles and N poles of the sixth column of light-emitting chips are same;

the fifth column of light-emitting chips and the sixth column of light-emitting chips are mirror-symmetrical; and the first column of light-emitting chips and the second column of light-emitting chips are mirror-symmetrical.

5. The display device according to claim 4, wherein a minimum distance between each of the N poles of the fifth column of light-emitting chips and each of the P poles of the first column of light-emitting chips is less than a minimum distance between each of the N poles of the fifth column of light-emitting chips and each of the N poles of the first column of light-emitting chips; and a minimum distance between each of the N poles of the second column of light-emitting chips and each of the P poles of the sixth column of light-emitting chips is less than a minimum distance between each of the N poles of the second column of light-emitting chips and each of the N poles of the sixth column of light-emitting chips.

6. The display device according to claim 4, wherein a minimum distance between each of the N poles of the fifth column of light-emitting chips and each of the P poles of the first column of light-emitting chips is greater than a minimum distance between each of the N poles of the fifth column of light-emitting chips and each of the N poles of the first column of light-emitting chips; and a minimum distance between each of the N poles of the second column of light-emitting chips and each of the P poles of the sixth column of light-emitting chips is less than a minimum distance between each of the N poles of the second column of light-emitting chips and each of the N poles of the sixth column of light-emitting chips.

* * * * *